(12) United States Patent
Kurunczi et al.

(10) Patent No.: US 11,715,621 B2
(45) Date of Patent: Aug. 1, 2023

(54) SCANNED ANGLED ETCHING APPARATUS AND TECHNIQUES PROVIDING SEPARATE CO-LINEAR RADICALS AND IONS

(71) Applicant: APPLIED Materials, Inc., Santa Clara, CA (US)

(72) Inventors: Peter F. Kurunczi, Cambridge, MA (US); Morgan Evans, Manchester, MA (US); Joseph C. Olson, Beverly, MA (US); Christopher A. Rowland, Rockport, MA (US); James Buonodono, Amesbury, MA (US)

(73) Assignee: APPLIED Materials, Inc., Santa Clara, CA (US)

( * ) Notice: Subject to any disclaimer, the term of this patent is extended or adjusted under 35 U.S.C. 154(b) by 614 days.

(21) Appl. No.: 16/535,885

(22) Filed: Aug. 8, 2019

(65) Prior Publication Data
US 2020/0194226 A1    Jun. 18, 2020

Related U.S. Application Data

(60) Provisional application No. 62/780,729, filed on Dec. 17, 2018.

(51) Int. Cl.
*H01J 37/30*    (2006.01)
*H01J 37/305*    (2006.01)
(Continued)

(52) U.S. Cl.
CPC .......... *H01J 37/3053* (2013.01); *H01J 37/08* (2013.01); *H01J 37/20* (2013.01);
(Continued)

(58) Field of Classification Search
CPC ........ G02B 5/1857; H01J 37/08; H01J 37/20; H01J 37/3053; H01J 37/3056;
(Continued)

(56) References Cited

U.S. PATENT DOCUMENTS 4,153,529 A * 5/1979 Little ................. G02F 1/13378
204/192.15
4,734,158 A * 3/1988 Gillis ................. H01L 21/3065
438/712
(Continued)

FOREIGN PATENT DOCUMENTS

EP    0562848 A2    9/1993
JP    S63271856 A    11/1988
(Continued)

OTHER PUBLICATIONS

6cm×66cm RF Ion Source, Provides Highly Uniform Ion Beam Processing of Large-Scale Substrates, http://www.veeco.com/products/6cm-x-66cm-rf-ion-source, downloaded May 11, 2021; 2 pages.
(Continued)

*Primary Examiner* — Rodney G McDonald
(74) *Attorney, Agent, or Firm* — KDW Firm PLLC (57) ABSTRACT

A system may include a substrate stage, configured to support a substrate, where a main surface of the substrate defines a substrate plane. The system may include an ion source, including an extraction assembly that is oriented to direct an ion beam to the substrate along a trajectory defining a non-zero angle of incidence with respect to a perpendicular to the substrate plane. The system may include a radical source oriented to direct a radical beam to the substrate along a trajectory defining the non-zero angle of incidence with respect to a perpendicular to the substrate plane. The substrate stage may be further configured to scan the substrate along a first direction, lying with the substrate plane, while the main surface of the substrate is oriented within the substrate plane.

20 Claims, 5 Drawing Sheets

(51) Int. Cl.
*H01J 37/20* (2006.01)
*H01J 37/08* (2006.01)

(52) U.S. Cl.
CPC .............. *H01J 2237/0041* (2013.01); *H01J 2237/0822* (2013.01); *H01J 2237/20228* (2013.01); *H01J 2237/3174* (2013.01)

(58) Field of Classification Search
CPC .......... H01J 37/32357; H01J 37/32376; H01J 37/32422; H01J 37/0041; H01J 37/0044; H01J 37/0822; H01J 37/20228; H01J 37/3151; H01J 37/3174; H01L 21/306; H01L 21/68785
See application file for complete search history.

(56) References Cited

U.S. PATENT DOCUMENTS

| | | | |
|---|---|---|---|
| 4,874,459 A * | 10/1989 | Coldren | H01J 37/3053 438/711 |
| 8,101,510 B2 | 1/2012 | Godet et al. | |
| 8,664,098 B2 | 3/2014 | Godet et al. | |
| 8,835,879 B1 | 9/2014 | Sinclair et al. | |
| 9,706,634 B2 | 7/2017 | Liang et al. | |
| 10,879,055 B2 * | 12/2020 | Hatem | H01L 21/3065 |
| 2006/0019477 A1 | 1/2006 | Hanawa | |
| 2006/0042752 A1 | 3/2006 | Rueger | |
| 2006/0260750 A1 | 11/2006 | Rueger | |
| 2007/0181820 A1 | 8/2007 | Hwang et al. | |
| 2008/0132046 A1 | 6/2008 | Walther | |
| 2008/0179186 A1 | 7/2008 | Shimura et al. | |
| 2009/0098306 A1 * | 4/2009 | Druz | H01J 37/32752 427/523 |
| 2013/0206583 A1 | 8/2013 | Druz et al. | |
| 2015/0011093 A1 | 1/2015 | Singh et al. | |
| 2015/0255243 A1 | 9/2015 | Godet et al. | |
| 2015/0311073 A1 | 10/2015 | Srinivasan et al. | |
| 2016/0035539 A1 | 2/2016 | Sainiemi et al. | |
| 2016/0064232 A1 | 3/2016 | Berry et al. | |
| 2016/0071734 A1 | 3/2016 | Graf et al. | |
| 2016/0189935 A1 | 6/2016 | Biloiu et al. | |
| 2017/0178866 A1 | 6/2017 | Radovanov et al. | |
| 2017/0250221 A1 | 8/2017 | Hayashi et al. | |
| 2018/0076007 A1 | 3/2018 | Gilchrist et al. | |

FOREIGN PATENT DOCUMENTS

| | | |
|---|---|---|
| JP | H06-163465 A | 6/1994 |
| JP | 2002-075968 A | 3/2002 |
| JP | 2005055773 A | 3/2005 |
| JP | 2012523120 A | 9/2012 |
| JP | 6118458 B1 | 3/2017 |
| JP | 2017-533542 A | 11/2017 |
| JP | 2018-529224 A | 10/2018 |
| KR | 20060085049 A | 7/2006 |
| TW | 201628045 A | 8/2016 |
| WO | 2010115110 A2 | 10/2010 |
| WO | 2018048566 A | 3/2018 |

OTHER PUBLICATIONS

Kuritzky et al., "Chemically assisted ion beam etching of laser diode facets on nonpolar and semipolar orientations of GaN,"; Semiconductor Science and Technology, vol. 31, No. 7, Published Jun. 13, 2016, Semicond. Sci. Technol. 31 075008, (http://iopscience.iop.org/article/10.1088/0268-1242/31/7/075008), downloaded May 6, 2021; 8 pages.

http://www.mtu.edu/microfabrication/capabilities/plasma/images/caibe-diagram-800banner.jpg; downloaded May 5, 2021; 1 page.

http://nebula.wsimg.com/1aae02780d27abbbb74aa375a5301e2b?AccessKeyId=3D7549092B5B83FF0E81&disposition=0&alloworigin=1, "Classic Gridless Ion Beam Sources", downloaded May 6, 2021; 6 pages.

International Search Report and Written Opinion for the International Patent Application No. PCT/US2019/064684, dated Mar. 24, 2020, 9 pages.

International Search Report and Written Opinion for the International Patent Application No. PCT/US2019/064475, dated Mar. 20, 2020, 8 pages.

* cited by examiner

SCANNED ANGLED ETCHING APPARATUS AND TECHNIQUES PROVIDING SEPARATE CO-LINEAR RADICALS AND IONS

RELATED APPLICATIONS

This application claims priority to U.S. Provisional Patent Application No. 62/780,729, filed Dec. 17, 2018, entitled SCANNED ANGLED ETCHING APPARATUS HAVING SEPARATE RIBBON FLUXES OF CO-LINEAR REACTIVE RADICALS AND ENERGETIC IONS, and incorporated by reference herein in its entirety.

FIELD

This disclosure relates to substrate processing to generate angled structures, including optical elements, and more particularly to approaches for forming angled structures, such as gratings.

BACKGROUND

Forming devices within a substrate that include angled features, such as optical gratings, may entail the use of reactive etching, including reactive ion beam etching and related techniques. Often, both ions and radicals are directed to a substrate to perform etching. To etch angled structures over a macroscopic surface, such as over a large wafer, a substrate may be scanned or rotated with respect to a source of ions or source of radicals, while being tilted with respect to the scan direction and the ion beam and radicals. Notably, this configuration results in the situation where a portion of the substrate closest to the flux source is exposed to a higher flux density at the smaller beam envelope compared to the portion of the substrate tilted furthest from the flux source. Thus, a non-uniform etch process may result.

With respect to these and other considerations, the present embodiments are provided.

BRIEF SUMMARY

In one embodiment, a system is provided, including a substrate stage, configured to support a substrate, where a main surface of the substrate defines a substrate plane. The system may include an ion source, including an extraction assembly that is oriented to direct an ion beam to the substrate along a trajectory defining a non-zero angle of incidence with respect to a perpendicular to the substrate plane. The system may include a radical source oriented to direct a radical beam to the substrate along a trajectory defining the non-zero angle of incidence with respect to a perpendicular to the substrate plane. The substrate stage may be further configured to scan the substrate along a first direction, lying with the substrate plane, while the main surface of the substrate is oriented within the substrate plane.

In an additional embodiment, a method of treating a substrate includes providing the substrate on a substrate stage. The substrate may be characterized by a main surface of the substrate that defines a substrate plane. The method may include directing an ion beam to the substrate along a trajectory defining a non-zero angle of incidence with respect to a perpendicular to the substrate plane. The method may further include directing a radical beam to the substrate along a trajectory defining the non-zero angle of incidence with respect to the perpendicular to the substrate plane, and scanning the substrate along a first direction, the first direction lying with the substrate plane, while the main surface of the substrate is oriented within the substrate plane.

In a further embodiment, a reactive angled ion beam etching system is provided, including a substrate stage, arranged to support a substrate and to scan the substrate along a first direction, lying within a substrate plane, defined by a main surface of the substrate. The reactive angled ion beam etching system may include a plasma chamber, comprising an extraction assembly disposed along a side of the plasma chamber, and facing the substrate stage. The extraction assembly may include a plurality of extraction electrodes, oriented to extract an ion beam and direct the ion beam along a non-zero angle of incidence with respect to a perpendicular to the substrate plane. The reactive angled ion beam etching system may include a radical source, oriented to direct a radical beam along a trajectory defining the non-zero angle of incidence with respect to the perpendicular to the substrate plane. As such, a given region of the substrate is exposed to the ion beam and the radical beam in a sequential manner when the substrate is scanned along the first direction.

BRIEF DESCRIPTION OF THE DRAWINGS

The accompanying drawings illustrate exemplary approaches of the disclosure, including the practical application of the principles thereof, as follows.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

In various embodiments, novel plasma sources are provided, wherein the plasma sources are arranged wherein energetic ions and radicals are generated such that the output apertures of the plasma sources allow for the flux of radicals and ions to be co-linear, the mean angle of both the radical flux and ion flux are identical, and the angle spread of these two fluxes are similar.

In some embodiments, an apparatus is provided to achieve a uniform reactive radical assisted ion beam etching of angled features (trenches, holes, sidewalk, slopes etc.) by means of independent fluxes of energetic ions, reactive radicals, and neutralizing electrons. According to various embodiments, the ion fluxes and radical fluxes have a ribbon shape, and are directed at an angle relative to the substrate normal, while a substrate is scanned through these fluxes to achieve a uniform isocentric process. Co-linearity of the fluxes of ions and radicals is achieved, where the mean angle of the neutral flux is the same or near to the mean angle of the ion flux so as to maximize the amount of reactive radicals that the travel to the etch front of substrate features, such as a deep angled etch feature to minimize aspect ratio dependent etching (ARDS). The generation of independently created and controlled fluxes of ions and radicals allows for wider and optimal range of etch processes.

The present embodiments thus provide the ability to perform an angled etch through a combination of an isocentric linear scanning, a co-linear ribbon-shaped ion and radical fluxes, and an independent control of ion and racial fluxes by utilizing two separate plasma sources. In ion implantation processing, the term "isocentric" is used to mean that the mechanical scan direction of a substrate is in a plane parallel to the surface of a substrate being implanted. Accordingly, the term "isocentric" as used herein may refer to a similar geometry for processing a substrate, where a main surface of a substrate (such as a main wafer surface) is oriented in a plane parallel to a plane of the scan direction.

Figure 1A:
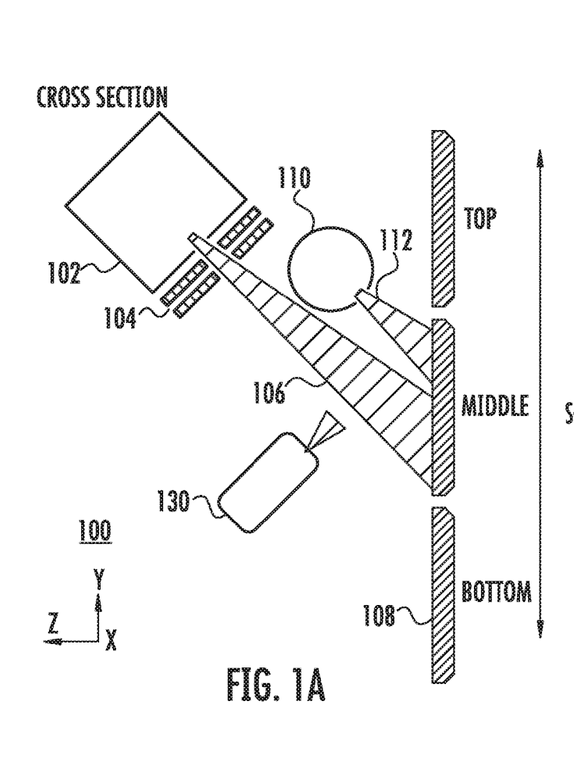
FIG. 1A and FIG. 1B show a side view and top plan schematic view of an exemplary system.
Figure 1B:
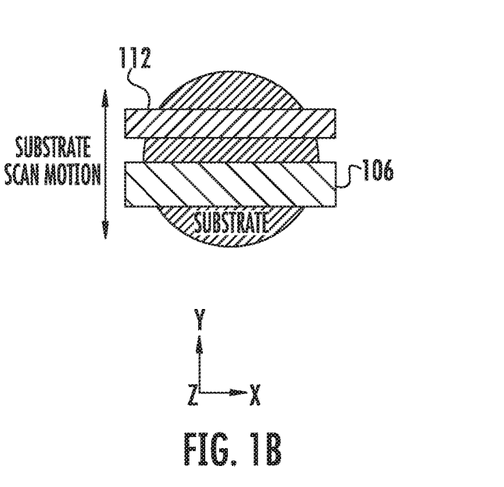

FIG. 1A illustrates a general cross section of a system 100 according to embodiments of the disclosure. The system 100 includes an ion source 102, including an extraction assembly 104, such as a triode extraction assembly. In various embodiments, the ion source 102 include a plasma chamber, where the extraction assembly 104 includes generally rectangular and elongated extraction apertures to generate an ion beam 106, having a generally rectangular cross-section, as shown in FIG. 1B. The aspect ratio of the extraction apertures, as well as the ion beam (X-dimension/Y-dimension) may be 2/1, 3/1, 5/1, 10/1, 50/1 or greater according to various non-limiting embodiments. In various embodiments, the ion source 102 may be configured as an RF plasma chamber, while other types of ion source chambers are possible. The extraction assembly 104 may be a triode arrangement including extraction, suppression, and ground apertures. The embodiments are not limited in this context.

In various non-limiting embodiments, the ion source plasma typically may include either a noble gas, nitrogen, oxygen, hydrogen, hydrocarbons $C_yH_x$, halogen containing molecules (($C_xF_y$, $NF_x$, $SF_x$, etc), or any combination of the above. In various implementations, the ion source 102 may be biased with respect to a substrate 108 at a given extraction potential, to generate a given ion energy to the ion beam 106. The substrate 108 may be arranged in a separate process chamber (not shown). In various embodiments, the extraction assembly 104 may be arranged to direct the ion beam 106 along a trajectory forming a given non-zero angle of incidence (θ) with respect to a perpendicular (Z-axis) to a substrate plane (X-Y) plane, defined by the main surface of a substrate, such as a wafer surface.

The system 100 may further include a radical source 110, where the radical source 110 is arranged to generate a flux of radicals, shown as radical beam 112. The radical beam 112 may include neutrals. The radical source may be a plasma radical source. The radical source 110 may be a rf-generated plasma source, where reactive radicals are generated from halogen containing molecular gases ($C_xF_y$, $NF_x$, $SF_x$, etc), in addition to a mix of other gases (noble gases, oxygen, nitrogen, hydrogen, hydrocarbons $C_yH_x$, etc). The radical source 110 may include an aperture so as to direct the radical beam along the given non-zero angle of incidence with respect to the perpendicular (Z-axis), the same as the angle of ion beam 106. Similarly to ion beam 106, the radical beam 112 may be elongated along the X-axis in some embodiments, as shown in FIG. 1B. According to various embodiments of the disclosure, because the radical source 110 may be separately powered and separately supplied with gas from the ion source 102, the ratio of radical flux to ion flux may be independently controlled, providing a tunable process for directing colinear radicals and ions. Generally, the radical beam 112 may include mostly reactive neutrals with some fraction of ions. For example, the input gas may be $CF_4$ (carbon tetrafluoride). By itself $CF_4$ is very inert (like inert argon or $N_2$), but when dissociated in the plasma (by the plasmas energetic electrons) the parent $CF_4$ will be broken up into daughter fragments such as $CF_3$, $CF_2$, CF, F, C. The fluorine containing daughter fragments that now have an open bond are chemically reactive and useful for a surface etching process. In addition to generating neutral CFx radicals, there will also be ionized radicals like $CFx^+$ as well, but the overall flux is mostly neutrals in various embodiments.

In various embodiments, the substrate 108 may be scanned along the Y axis of the Cartesian coordinate system shown, where the main substrate surface is arranged parallel to the X-Y plane during scanning. In the illustration of FIG. 1A, the substrate 108 scans vertically (along the Y-axis) through a flux of ions and radicals impinging at a given non-zero angle of incidence. In other embodiments, the apparatus of FIG. 1A may be oriented wherein the substrate 108 scans horizontally, with the various components depicted in FIG. 1A arranged to have the same relative orientation to one another. The outputs of both the ion source 102 and the radical source 110 are accordingly directed co-linearly along the same non-zero angle with respect to a substrate scan direction (Y-axis), and are thus able to achieve an isocentric process (allowing for a spread of angles around a mean non-zero angle of incidence). A neutralizing source, shown as neutralizing plasma source 130, may also be provided in system 100 to generate electrons in the vicinity of the ion beam to neutralize both the ion beam space charge and any excess positive charge on the substrate.

Figure 1C:
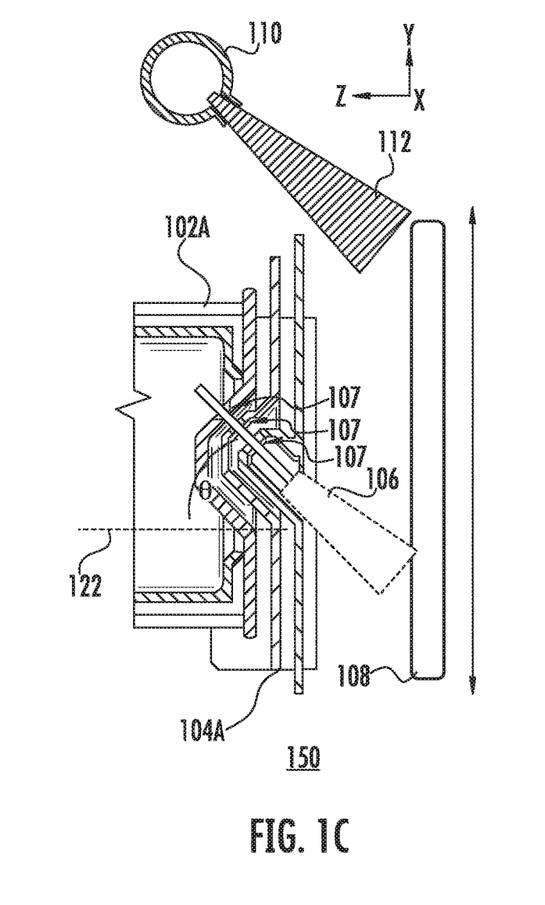
FIG. 1C show a side view of another exemplary system.

To generate an ion beam at a non-zero angle of incidence with respect to the Z-axis (perpendicular to substrate plane or scan plane), in one embodiment, an entire ion source may be tilted with respect to the scan plane (X-Z plane), as suggested in FIG. 1A. In other embodiments, as shown in FIG. 1C, an ion source may be arranged as a plasma chamber, adjacent to a process chamber housing the substrate 108, where the ion source 102A includes an extraction assembly 104A, having a triode configuration (or tetrode, or greater number of electrodes). As shown in FIG. 1C, a system 150 is provided where the extraction assembly is defined by a "tilted extraction electrode" geometry. The various electrodes (in this case three electrodes are shown, defining a triode geometry) are arranged as plates having outer portions that are parallel to the scan plane of the substrate (X-Y plane), while the apertures 107 in the respective electrodes of extraction assembly 104A are staggered from one another along the Y-direction (scan direction), to define an angle of incidence θ with respect to the normal (parallel to the Z-axis), shown as perpendicular 122. In this manner, the ion beam 106 may be directed along the same angle of incidence with respect to the perpendicular 122, as the ion beam 106 emerges from the extraction assembly 104A. This geometry advantageously facilitates placement of a plasma chamber, defining the ion source 102A, immediately adjacent the substrate 108, where the separation (along the Z-axis) between the substrate 108 and ion source 102A may be on the order of a few centimeters, or as small as one centimeter. Additionally, the plasma chamber (ion source 102A) need not be tilted to generate an ion beam, tilted with respect to the perpendicular 122.

Figure 1D:
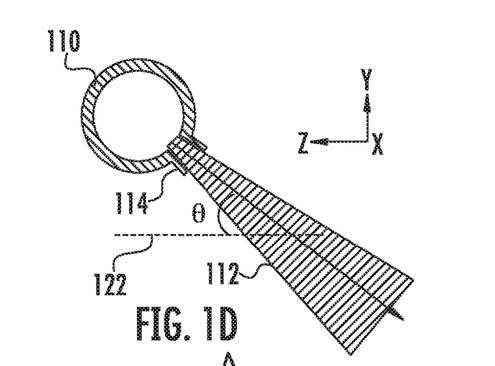
FIG. 1D shows a side view of an exemplary radical source.
Figure 1E:
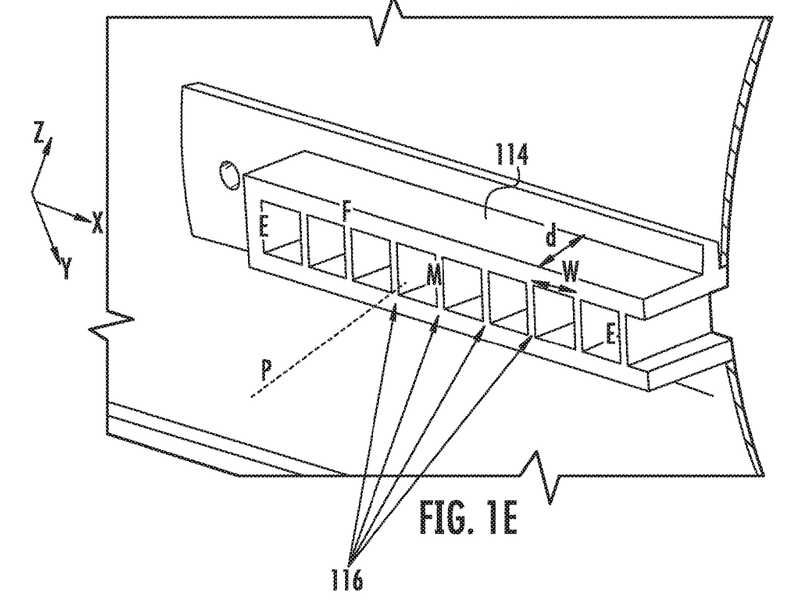
FIG. 1E. shows a perspective view of an exemplary nozzle of a radical source.

FIG. 1D and FIG. 1E illustrate details of one embodiment of the radical source 110, including a nozzled aperture 114. The nozzled aperture 114 may have a certain depth to help direct neutral radicals along a mean angle (shown as an angle of incidence θ) and to limit the angular spread around the angle of incidence θ. As illustrated in FIG. 1D, nozzled aperture 114 may also be divided along the X-axis into plurality of partitions, forming a honeycomb structure 116. The partitions define a face of the nozzle, shown as the plane F. The various partitions limit the angular spread about a perpendicular P to the face F. Said differently, absent the partitions provided by the honeycombed structure 116, the angular spread of flux emitted from the radical source 110 about the perpendicular P in the P-X plane may be large, since radicals emitted from the middle M of the nozzled aperture 114 could diverge all the way to the edges E without collision. The honeycombed structure 116 limits the maximum divergence based upon the width W and depth d of the individual partitions.

Figure 2:
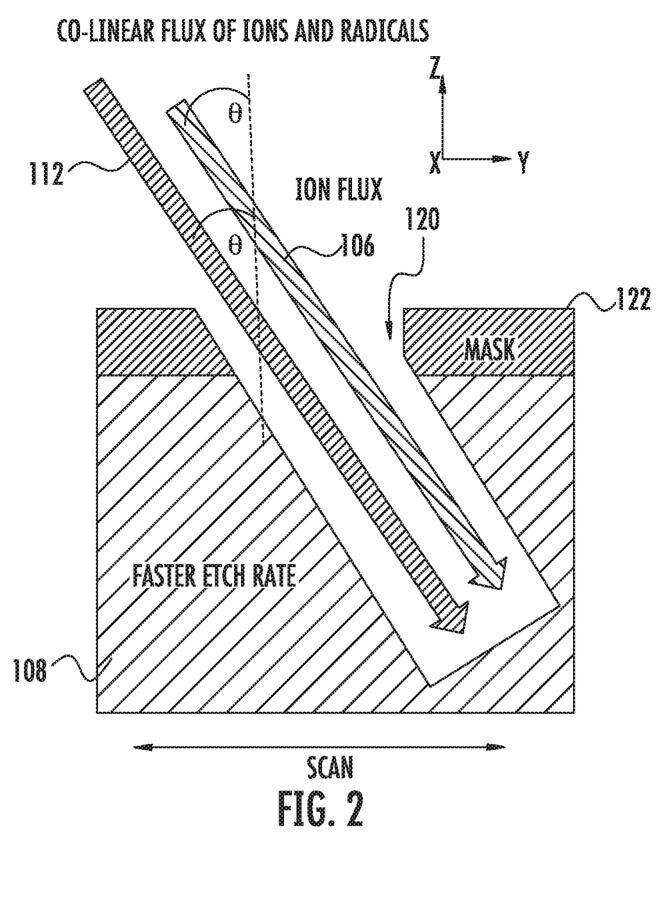
FIG. 2 presents details of etching geometry according to embodiments of the disclosure.
Figure 3:
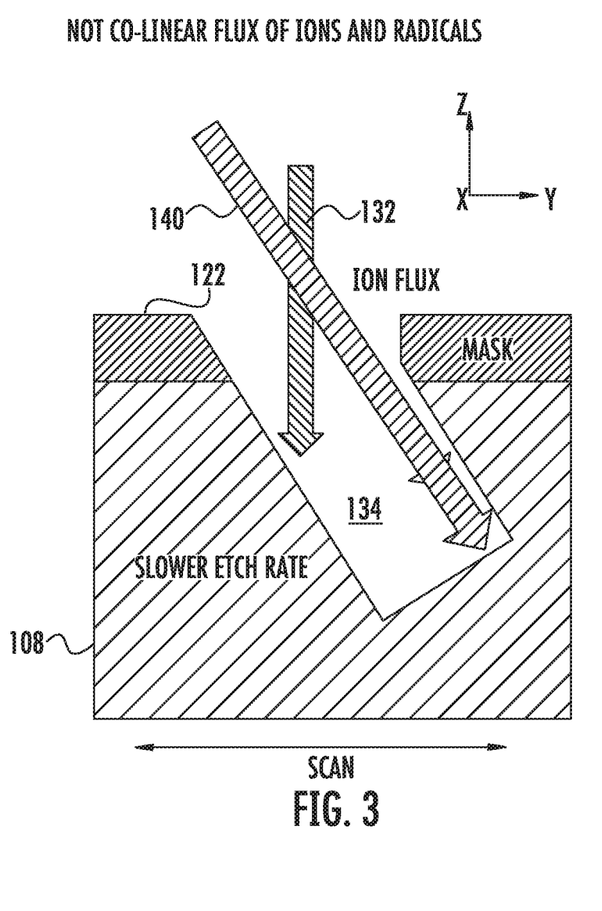
FIG. 3 presents a reference etch geometry.

FIG. 2 and FIG. 3 illustrate the geometry of angled etching using apparatus arranged according to embodiments of the present disclosure. In particular FIG. 2 shows the advantage of etching a high aspect ratio angled feature provided by the present embodiments, such as the embodiments of FIGS. 1A-1E. In FIG. 2, separate fluxes of ions and radical are directed along co-linear or mutually parallel trajectories with respect to the substrate scan direction. FIG. 2 illustrates the geometry of colinear radical and ion flux provided by the present embodiments. Notably, the dimensions of the radical beam 112 and the ion beam 106 may not be drawn to scale, wherein the width of a trench 120 being etched is on the order of micrometers or nanometers in some examples, while the width of the radical beam 112 and ion beam 106 is on the order of millimeters of centimeters. Thus, the radical beam 112 and the ion beam 106 may be separated from one another (along the Y-axis) to a greater extent than suggested in FIG. 2, such that the ion beam 106 and the radical beam 112 do not treat the trench 120 at the same time. Rather, the trench 120 may be treated sequentially by the ion beam 106 and the radical beam 112, as the substrate 108 is scanned along the Y-axis.

The geometry of FIG. 2 allows both the radical flux and the ion flux to impinge upon the bottom of the etch front of a trench 120. In contrast, in FIG. 3, the geometry of etching species is shown, where the radical flux 132 is directed at a different angle from the ion beam 140. In this case, the ion beam 140 may form a non-zero angle of incidence with respect to the perpendicular (Z-axis) to the substrate plane (X-Y plane), helping to define the general angle of inclination of the trench 134 formed by etching using the ion beam 140 and radical flux 132. Notably, the radical flux is directed along the perpendicular (Z-axis), where the etch front at the bottom of the trench 134 may be starved of necessary reactive radicals, especially as the trench 134 deepens, and the etch rate will slow down. Thus, the geometry of FIG. 3 suffers from larger aspect ratio dependent etch effects (ARDE). One result is an overall relatively faster etch rate in the geometry of FIG. 2 as opposed to the geometry of FIG. 3.

Figure 4A:
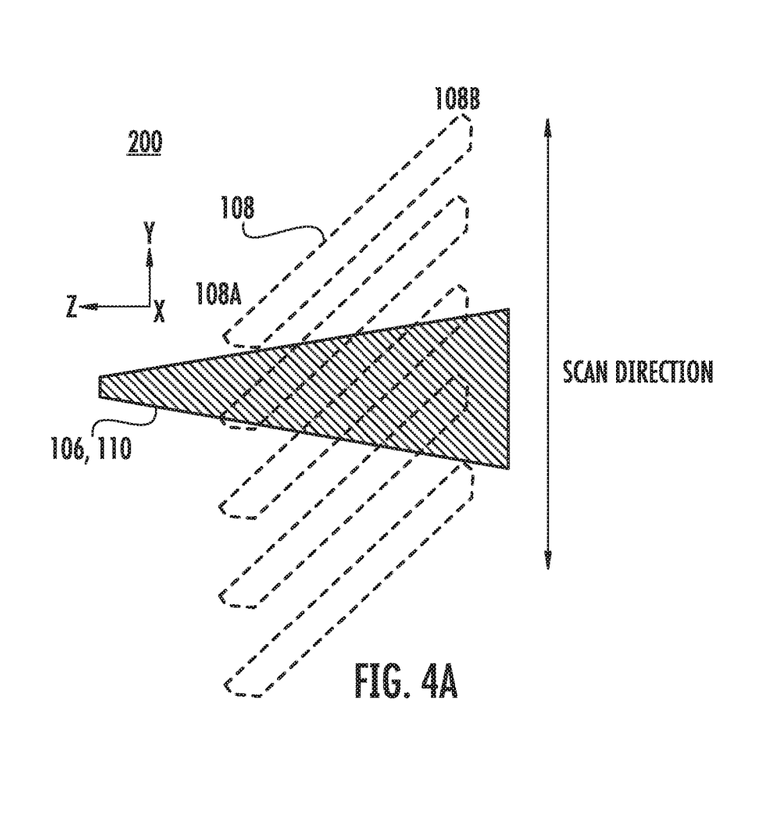
FIG. 4A to FIG. 4C illustrate a reference arrangement for scanning a substrate.
Figure 4B:
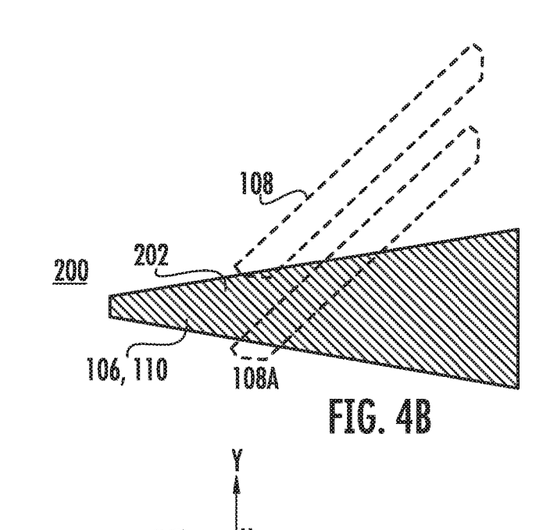
Figure 4C:
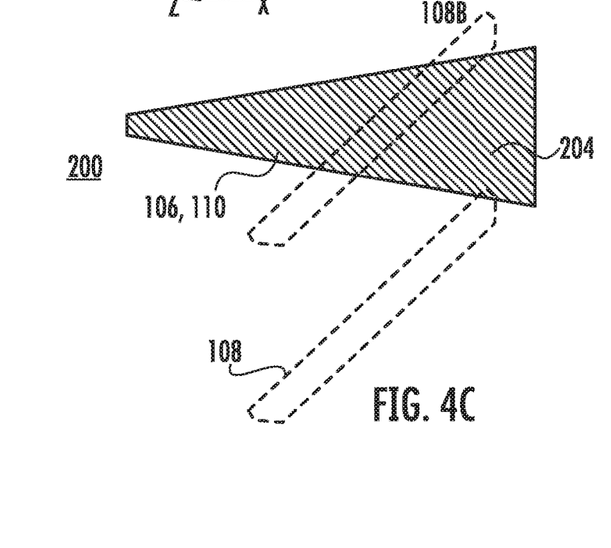

By way of further explanation, FIG. 4A to FIG. 4C illustrate a reference arrangement 200 for scanning a substrate. In this example, non-isocentric scanning takes place. The non-isocentric scanning is characterized by the ion beam or radical beam being tilted at a non-zero angle of incidence with respect to a perpendicular to the substrate plane. However, unlike in isocentric scanning, where the substrate is scanned along a direction within the substrate plane (parallel to the substrate plane), the substrate in non-isocentric scanning is scanned in a direction forming a non-zero angle with respect to the substrate plane. In other words, in FIG. 4A, the scan direction is along the Y-axis, while the beam is directed along the Z-axis. To accomplish angled etching in the non-isocentric scanning, the substrate plane is tilted at a non-zero angle with respect to the Z-axis, and also at a second non-zero angle with respect to the X-Y plane and with respect to the Y-axis, as shown. This geometry may result in non-uniform processing in the following manner. In many circumstances, the beam of ions or radicals may form a divergent radical beam, as well as a divergent ion beam, even diverging at a small divergence angle, such as 10 degrees or less. The flux of a beam of ions or radicals having even a small angular spread will become wider as propagating along the Z-direction, as shown. Because of the geometry of the non-isocentric scanning, portions of the substrate, shown as region 108A, are disposed closer to the ion source or radical source (to the left of the figure), while other portions, shown as region 108B, are disposed further from the ion source or radical source, and remain so, as the substrate is scanned along the Y-axis. FIG. 4B and FIG. 4C further illustrate the differential flux density (meaning, different levels of ion flux density) received in different portions of a substrate 108, when scanned in a non-isocentric manner. As shown therein, the bottom of the tilted wafer (substrate 108) in region 108A scans through the narrowest (denser) portion of the ion beam 106, shown as region 202. In comparison, the top portion of the tilted wafer, in region 108B, scans through a taller (less dense) portion of the ion beam 106, shown as region 204. Because the distance between ion source or radical source and the region 108A may remain closer than the distance between ion source or radical source and region 108B, the region 108B may continue to receive a lower flux density throughout the scan, resulting in in differing treatment conditions at different points on the substrate, for example. More particularly, during non-isocentric scanning the substrate spends less time in the region 202 than in region 204, so while the flux is denser in region 202 than in region 204, the overall process difference between substrate portions scanned through the different regions may be reduced depending on the spread of directions of the ion beam into and out of the plane of the figures. The isocentric geometry of the present embodiments, where the throw distance between flux sources and substrate may be the same at all substrate positions, avoids these complications.

Figure 5:
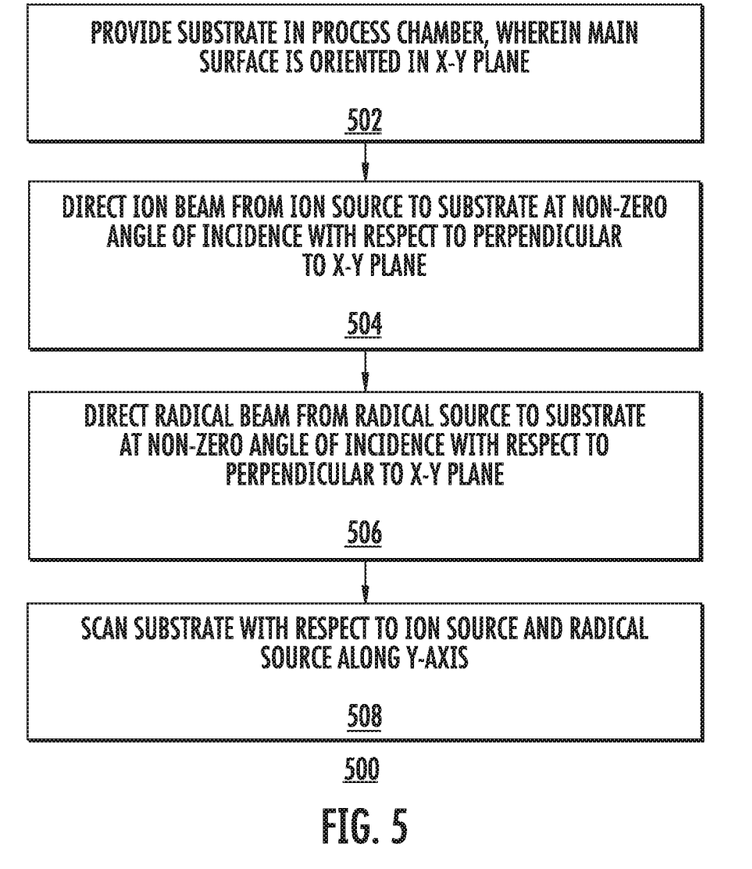
FIG. 5 presents an exemplary process flow.

FIG. 5 presents an exemplary process flow 500. At block 502, a substrate is provided in a process chamber, wherein a main surface of the substrate is oriented in an X-Y plane. The main surface may represent a surface of a wafer for example. The substrate may be provided on a substrate holder in some embodiments, where a flat surface of the substrate holder is oriented parallel to the main surface. At block 504, an ion beam is directed to the substrate from an ion source at a non-zero angle of incidence with respect to a perpendicular (Z-axis) to the X-Y plane. The ion source may be a plasma source according to various embodiments. The ion beam may be extracted from a plasma chamber of the plasma source using an extraction assembly, such as a triode assembly. At block 506 a radical beam is directed to the substrate from a radical source at the same non-zero angle of incidence. The radical source may be a plasma-based radical source, separate from the ion source, where the radical beam may include neutral species. At block 508, the substrate is scanned with respect to the ion source and radical source along the Y-axis, while the radical beam and the ion beam are directed to the substrate. In some embodiments, the radical beam and ion beam may comprise an elongated cross-section (with the long direction along the X-axis), defining so called ribbon beams. As the substrate is scanned different portions of the substrate may be exposed to the radical flux and ion flux sequentially, where the radical flux and ion flux are provided in an isocentric manner.

The present embodiments thus provide advantages over known etching systems, such as reactive etching systems that provide non-isocentric radical flux and ion flux. The known systems suffer from a non-uniform process across the substrate in the scan direction, where a portion of the substrate that is closest to the flux source is exposed to a higher flux density at the smaller beam envelope compared to the portion of the substrate that is tilted furthest from the flux source. Thus, a first advantage provided by the apparatus of the present embodiments, is the uniform radical flux (or uniform radical flux density) and uniform ion flux (or uniform ion flux density) provided across different portions of a scanned substrate, even when the radical flux and ion flux is directed at a non-zero angle with respect to the perpendicular to the substrate plane. Another advantage provided by the apparatus disclosed herein, is the ability to etch angled features within a substrate such as angled trenches, or angled vias, to name two structures, independent of feature depth or aspect ratio, since the radical flux and ion flux may be provided along parallel trajectories.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A system, comprising:
a substrate stage, configured to support a substrate, wherein a main surface of the substrate defines a substrate plane;
an ion source, the ion source comprising an extraction assembly, the extraction assembly oriented to direct an ion beam comprising ion flux to the substrate along a trajectory defining a non-zero angle of incidence with respect to a perpendicular to the substrate plane; and
a radical source, the radical source oriented to direct a radical beam comprising radical flux to the substrate along a trajectory defining the non-zero angle of incidence with respect to a perpendicular to the substrate plane,
wherein the substrate stage is further configured to scan the substrate along a first direction, the first direction lying with the substrate plane, while the main surface of the substrate is oriented within the substrate plane, wherein the radical flux is displaced along the first direction with respect to the ion flux at the substrate plane.

2. The system of claim 1, the ion source comprising a first plasma source, and the radical source comprising a second plasma source.

3. The system of claim 1, further comprising a neutralizing source, disposed between the ion source and the substrate stage, the neutralizing source arranged to direct electrons to the ion beam.

4. The system of claim 1, the ion source comprising an extraction assembly, wherein the extraction assembly further comprises a plurality of extraction electrodes.

5. The system of claim 4, wherein the plurality of extraction electrodes are staggered from one another along the first direction.

6. The system of claim 4, wherein the plurality of extraction electrodes are elongated along a second direction, perpendicular to the first direction.

7. The system of claim 1, wherein the radical source comprises a nozzle, elongated along a second direction, perpendicular to the first direction.

8. The system of claim 7, wherein the nozzle comprises a plurality of partitions along the second direction.

9. The system of claim 1, wherein the ion beam comprises a divergent ion beam and the radical beam comprises a divergent radical beam, wherein an ion flux density of the divergent ion beam and a radical flux density of the divergent radical beam are uniform across the substrate.

10. A method of treating a substrate, comprising:
providing the substrate on a substrate stage, wherein a main surface of the substrate defines a substrate plane;
directing an ion beam comprising ion flux to the substrate along a trajectory defining a non-zero angle of incidence with respect to a perpendicular to the substrate plane;
directing a radical beam comprising radical flux to the substrate along a trajectory defining the non-zero angle of incidence with respect to the perpendicular to the substrate plane; and
scanning the substrate along a first direction, the first direction lying with the substrate plane, while the main surface of the substrate is oriented within the substrate plane, wherein the radical flux is displaced along the first direction with respect to the ion flux at the substrate plane.

11. The method of claim 10, wherein the directing the ion beam comprises extracting the ion beam from an ion source through an extraction assembly, wherein the extraction assembly further comprises a plurality of extraction electrodes, and wherein the plurality of extraction electrodes are staggered from one another along the first direction.

12. The method of claim 11, wherein the plurality of extraction electrodes are elongated along a second direction, perpendicular to the first direction.

13. The method of claim 11, wherein the radical beam is extracted from a radical source, the radical source comprising a nozzle, elongated along a second direction, perpendicular to the first direction.

14. The method of claim 13, wherein the nozzle comprises a plurality of partitions along the second direction.

15. The method of claim 10, wherein the ion beam comprises a divergent ion beam and the radical beam comprises a divergent radical beam, wherein an ion flux density of the divergent ion beam and a radical flux density of the divergent radical beam are uniform across the substrate.

16. A reactive angled ion beam etching system, comprising:
- a substrate stage, arranged to support a substrate and to scan the substrate along a first direction, the first direction lying within a substrate plane, defined by a main surface of the substrate;
- a plasma chamber, the plasma chamber comprising an extraction assembly disposed along a side of the plasma chamber, and facing the substrate stage, the extraction assembly comprising a plurality of extraction electrodes, oriented to extract an ion beam comprising ion flux and direct the ion beam along a non-zero angle of incidence with respect to a perpendicular to the substrate plane; and
- a radical source, the radical source oriented to direct a radical beam comprising radical flux along a trajectory defining the non-zero angle of incidence with respect to the perpendicular to the substrate plane, and
- wherein a given region of the substrate is exposed to the ion beam and the radical beam in a sequential manner when the substrate is scanned along the first direction, wherein the radical flux is displaced along the first direction with respect to the ion flux at the substrate plane.

17. The reactive angled ion beam etching system of claim 16, further comprising a neutralizing source, disposed between the ion source and the substrate stage, the neutralizing source arranged to direct electrons to the ion beam.

18. The reactive angled ion beam etching system of claim 16, wherein the plurality of extraction electrodes are staggered from one another along the first direction.

19. The reactive angled ion beam etching system of claim 16, wherein the radical source comprises a nozzle, wherein the nozzle and the plurality of extraction electrodes are elongated along a second direction, perpendicular to the first direction.

20. The reactive angled ion beam etching system of claim 16, wherein the plurality of extraction electrodes are configured to generate the ion beam as a divergent ion beam and, wherein the nozzle is configured to generate the radical beam as a divergent radical beam, wherein an ion flux density of the divergent ion beam and a radical flux density of the divergent radical beam are uniform across the substrate.

* * * * *